United States Patent
Roberts

(10) Patent No.: US 9,733,301 B2
(45) Date of Patent: Aug. 15, 2017

(54) UNIVERSAL MULTIPLEXING INTERFACE SYSTEM AND METHOD

(75) Inventor: Howard Roberts, Austin, TX (US)

(73) Assignee: CELERINT, LLC, New York, NY (US)

( * ) Notice: Subject to any disclaimer, the term of this patent is extended or adjusted under 35 U.S.C. 154(b) by 399 days.

(21) Appl. No.: 13/022,383

(22) Filed: Feb. 7, 2011

(65) Prior Publication Data

US 2011/0193584 A1    Aug. 11, 2011

Related U.S. Application Data

(60) Provisional application No. 61/301,925, filed on Feb. 5, 2010, provisional application No. 61/301,931, filed on Feb. 5, 2010, provisional application No. 61/319,338, filed on Mar. 31, 2010, provisional application No. 61/319,347, filed on Mar. 31, 2010.

(51) Int. Cl.
  *G01R 31/00* (2006.01)
  *G01R 31/28* (2006.01)
  *G01R 1/073* (2006.01)

(52) U.S. Cl.
  CPC ..... *G01R 31/2834* (2013.01); *G01R 31/2889* (2013.01); *G01R 1/07385* (2013.01)

(58) Field of Classification Search
  CPC .......... G01R 31/31926; G01R 31/2884; G01R 31/2886; G01R 31/2889
  USPC ............ 324/756.05, 756.07, 754.08, 754.09, 324/762.01–762.03, 762.06, 538, 756.02
  See application file for complete search history.

(56) References Cited

U.S. PATENT DOCUMENTS

| | | | | |
|---|---|---|---|---|
| 5,955,888 A * | 9/1999 | Frederickson | ..... | G01R 31/2886 324/750.25 |
| 5,970,241 A * | 10/1999 | Deao | ..... | G06F 11/3632 712/227 |
| 5,994,894 A * | 11/1999 | Fujita | ..... | 324/756.02 |
| 6,040,691 A * | 3/2000 | Hanners et al. | ..... | 324/756.07 |
| 6,661,245 B1 * | 12/2003 | Reis | ..... | G01R 1/0416 324/755.05 |
| 6,856,150 B2 * | 2/2005 | Sporck et al. | ..... | 324/754.07 |
| 7,187,193 B2 * | 3/2007 | Wallquist | ..... | 324/750.15 |
| 7,381,908 B1 * | 6/2008 | Cantatore et al. | ..... | 174/541 |
| 7,388,390 B2 * | 6/2008 | Brueckner | ..... | G01R 31/01 702/118 |
| 7,679,372 B2 * | 3/2010 | Kurihara et al. | ..... | 324/537 |
| 7,859,277 B2 * | 12/2010 | Mayder et al. | ..... | 324/762.06 |

(Continued)

*Primary Examiner* — Huy Q Phan
*Assistant Examiner* — Adam Clarke
(74) *Attorney, Agent, or Firm* — Greenblum & Bernstein, P.L.C.

(57) ABSTRACT

A system for communicatively connecting devices for testing to respective test pins of a test head of an automatic test equipment (ATE). The system includes a tester interface device for communicative connection to the test pins of the ATE. The tester interface device includes a first connector and a second connector. The first connector is communicatively connected by the tester interface device to a first group of the test pins and the second connector is communicatively connected by the tester interface device to a second group of the test pins. The first group and the second group can be different test pins, same test pins, or combinations of some same and some different test pins. The system may also include a first pogo pin block device and a second pogo pin block device.

17 Claims, 5 Drawing Sheets

(56) References Cited

U.S. PATENT DOCUMENTS

| | | | |
|---|---|---|---|
| 7,960,991 B2* | 6/2011 | Shouji | 324/756.03 |
| 2003/0197521 A1* | 10/2003 | Weimer | 324/765 |
| 2005/0235263 A1* | 10/2005 | Bundy | G06F 11/263 |
| | | | 717/124 |
| 2005/0253617 A1* | 11/2005 | Roberts et al. | 324/765 |
| 2007/0063724 A1* | 3/2007 | Roberts et al. | 324/765 |
| 2008/0061766 A1* | 3/2008 | LaBerge | 324/158.1 |
| 2008/0076298 A1* | 3/2008 | Matsumura et al. | 439/584 |
| 2009/0276175 A1* | 11/2009 | Lee et al. | 702/82 |
| 2011/0260745 A1* | 10/2011 | Naitou | 324/756.05 |

* cited by examiner

UNIVERSAL MULTIPLEXING INTERFACE SYSTEM AND METHOD

CROSS-REFERENCE TO RELATED APPLICATIONS

The present application is a conversion of and has benefit of priority of the following applications: U.S. Provisional Patent Application No. 61/301,925, titled "Multiplexed Handler Platform For Reduced Index Time", filed Feb. 5, 2010; U.S. Provisional Patent Application No. 61/301,931, titled "Universal Multiplexing Interface", filed Feb. 5, 2010; U.S. provisional Patent Application No. 61/319,338, titled "Modular Test Head Specific Universal Interface", filed Mar. 31, 2010; and U.S. Provisional Patent Application No. 61/319,347, titled "Dynamically Expanded Test System and Method: DEPT and DECT", filed Mar. 2010. The present application is related to U.S. patent application Ser. No. 13/022,341, titled "MUXING INTERFACE PLATFORM FOR MULTIPLEXED HANDLERS TO REDUCE INDEX TIME SYSTEM AND METHOD", filed Feb. 7, 2011, which related application is by this reference hereby incorporated herein.

TECHNICAL FIELD

The present invention is related to automatic test equipment and robotic handlers and is more particularly related to a universal interface system for connecting automatic test equipment to more than one handler for presenting devices to the test equipment.

BACKGROUND

Manufacturing and production industries use automatic test equipment (ATE) to analyze and assess integrity and operability of manufactured products at various stages of production. Robotic manipulator machines are often employed during testing by ATE to manipulate workpieces and products into and out of connection with the ATE. The devices under test (DUTs) are presented to a test site of the ATE by the robotic machine, tested by the ATE, and then sorted and dispensed by the robotic machine into groups or bins (or otherwise according to applicable scheme) according to test results.

The ATE typically includes a system controller which controls the ATE and movement of data into and out of the ATE. The ATE also includes test data and test program storage, pattern memory, system power supplies, direct current reference supply unit, analog current reference supply unit, system clocks and calibration circuits, timing and timeset memory, and precision measurement unit (which may include digital, analog or mixed signal test resource circuitry). In addition, a test head of the ATE includes pin electronics driver cards providing pin circuitry (such as for comparators, current loads and other test resources) for pin electronics testing of DUTs. Conventionally, a device interface board (DIB) (also referred to as "load board) connects to the test head via respective tester pins of the ATE corresponding to the respective pin electronics and pin circuitry, and includes one or more test socket for the DUTs for testing by the ATE. The ATE also includes external interfaces for connection to robotic manipulators for test devices (referred to as "handlers" or "device handlers"), as well as interfaces to computers, networks, and/or other instruments, devices or components.

Robotic manipulators, i.e., handlers, include mechanical systems and handler controllers. Conventionally, the mechanical systems physically deliver DUTs for connection to the socket(s) of the DIB connected to the test head of the ATE, deposit the DUTs in the socket(s) during testing, remove the DUTs from the socket(s) post testing, and sort the DUTs according to respective test result after testing. For a group of DUTs to be tested by the ATE, the handler controller directs operations of the mechanical systems of the handler and communicates with the ATE to successively transfer and connect DUTs for test, remove them post test, and retrieve next DUTs of the group for handling in same manner, until all DUTs of the group are tested by the ATE. As required, handlers can include additional features of memory and specific units according to application and testing environment.

Because many diverse types of DUTs are tested by ATEs, and DUTs may be tested at various stages of production (e.g., final test, workpiece probe, etc.), ATEs (including wafer probers) are varied in design according to particular purpose and device or product for testing. Similarly, robotic manipulator machines vary according to application and compatibility with the ATE. A particular variation among ATEs is the mechanical docking required for precisely connecting tester pins of the ATE to DUTs presented to the ATE by the robotic manipulator machine for the DUTs.

ATEs are typically of a "hard dock" (or "hard docking") type or of a "soft dock" (or "soft docking") type:

Hard docking is direct mechanical connection of the robotic manipulator machine to the ATE at the test head for precise placement of DUTs by the robotic machine in test sockets of the DIB connected to the test head. Hard docking has been desirable, for example, in the case of higher frequency testing and testing of complex or mixed-signal devices, because connection of the robotic machine to the ATE at the test head limits DUT and device interface board component stress that can be otherwise caused in operation of the robotic manipulator equipment where not precisely aligned at the ATE test head. Hard docking has also been desirable for test signal integrity between the test head and the DUTs positioned by the robotic machine, as well as to avoid undue vibration or other affects that may vary testing for successively positioned DUTs retained in test sockets during testing by the robotic manipulator equipment. Hard docking, however, requires particular positioning (within allowable test floor space) of ATE and robotic manipulator equipment and units. Moreover, extensive setup steps and requirements, for example, alignment by bars, guide pins, cam and/or vacuum lock, must typically be performed and validated for hard docking Extensive component changes may be necessary when switching ATE test head features or robotic manipulator equipment types.

Soft docking, on the other hand, is indirect mechanical connection of the robotic manipulator machine to the ATE, for example, by flexible cabling and interfacing devices, rather than direct mechanical connection as in hard docking Rather than mechanical alignment of the ATE and the robotic manipulator equipment, cables and intermediate interfaces from the ATE serve as connectors which can be located relative to the robotic equipment. Soft docking generally provides greater flexibility for test floor location of the robotic manipulator machine with respect to the ATE, allowing greater variability in location of equipment/units and use of test floor space. Moreover, soft docking can provide easier switching of ATE test head boards and features and of different robotic manipulator equipment types. Because soft docking does not directly mechanically connect the ATE and handler, however, test signals of the ATE are communicated via non-rigid cables coupled with interface device(s) during testing. For higher frequency tests, testing of complex devices, and certain other testing processes, indirect connection via soft docking can present problems, such as affects on test signal integrity, calibration and equipment. For example, test signals reaching soft docked test sockets pass through intermediate connector cables and interface devices between the ATE and test sockets (with consequent affects on the test signals) often vary significantly from actual test signals at the ATE. More extensive calibration efforts can be required because all intermediate connectors, as well as additional calibration equipment, steps, and features, can affect the test signal. Furthermore, test signal interference in soft dock configurations can result from environmental conditions (electrical, mechanical, magnetic, vibration, etc.) and changes in environment when test signals pass through intermediate connector cables and interface devices. Because no direct mechanical connection exists between the ATE test head and the robotic equipment in soft docking, connector cabling and interface devices are subjected to more stresses resulting in wear and damage. Depending on the particular testing by the ATE (e.g., test signal frequencies, timing and other characteristics), the tests may not be suitable for soft docking configuration because of limitations presented for distances, numbers and extents of intermediate cabling and interface devices of soft dock configuration.

It would, therefore, be advantageous to provide universal docking systems and methods for connecting automatic test equipment and robotic manipulator equipment. It would also be advantageous to eliminate or reduce problems that have been presented in hard docking and in soft docking It would further be advantageous to provide universal systems and methods for multiplexing robotic equipment, for example, more than one handler, in connection to test equipment. Therefore, universal docking systems and methods for multiplexing robotic manipulator equipment connected to same automatic test equipment, with other advantages, would be a significant improvement in the art and technology.

SUMMARY

An embodiment of the invention is a system for communicatively connecting devices for testing to respective test pins of an automatic test equipment (ATE). The system includes a tester interface device communicatively connected to the test pins of the ATE, the tester interface device includes a first connector and a second connector, the first connector is communicatively connected by the tester interface device to a first group of the test pins and the second connector is communicatively connected by the tester interface device to a second group of the test pins, a first device board communicatively connected to the first connector, and a second device board communicatively connected to the second connector.

Another embodiment of the invention is a system for communicatively connecting devices for testing to respective test pins of an automatic test equipment (ATE). The system includes a tester interface device communicatively connected to the test pins of the ATE, the tester interface device includes a first connector and a second connector, the first connector is communicatively connected by the tester interface device to a first group of the test pins and the second connector is communicatively connected by the tester interface device to a second group of the test pins, a first pogo pin block device communicatively connected to the first connector, and a second pogo pin block device communicatively connected to the second connector.

In certain aspects of the embodiments, a first cable (or cable bundle) is communicatively connected to the first connector of the tester interface board and the first pogo pin block device, to distinctly communicatively connect each respective one of the first group to the first pogo pin block device, a second cable (or cable bundle) is communicatively connected to the second connector of the tester interface board and the second pogo pin block device, to distinctly communicatively connect each respective one of the second group to the second pogo pin block device.

In other certain aspects of the embodiments, a first load board including at least one first test socket for at least a portion of the devices is communicatively connectable to the first pogo pin block device for testing of the portion of the devices in the at least one first test socket and a second load board including at least one second test socket for at least another portion of the devices is communicatively connectable to the second pogo pin block device for testing of the portion of the devices in the at least one second test socket.

In yet other aspects of the embodiments, parallel test, concurrent test, parallel concurrent test, or combinations of these, is performed by same ATE at the at least one first test socket and the at least one second socket.

In further aspects of the embodiments, the first pogo block device replicates location of at least a portion of the respective test pins of the ATE, the portion of the respective test pins uniquely for testing of the portion of the devices via the at least one first test socket, and the second pogo block device replicates location of at least another portion of the respective test pins of the ATE, the portion of the respective test pins uniquely for testing of the portion of the devices via the at least one second test socket.

In certain aspects of the embodiments, conventional or unmodified device interface boards that would otherwise be connected to the test head via soft dock or hard dock are connectable to the respective first pogo block device and the second pogo block device as the first load board and the second load board, respectively.

Another embodiment of the invention is a method of docking a first load board and a second load board to an ATE. The method includes providing a tester interface board with respective mating connectors for respective test pins of a test head of the ATE, first connecting at least a portion of the mating connectors of the tester interface board to the first load board, and second connecting at least another portion of the mating connectors of the tester interface board to the second load board.

BRIEF DESCRIPTION OF THE DRAWINGS

The present invention is illustrated by way of example and not limitation in the accompanying figures, in which like references indicate similar elements, and in which.

DETAILED DESCRIPTION

Figure 1:
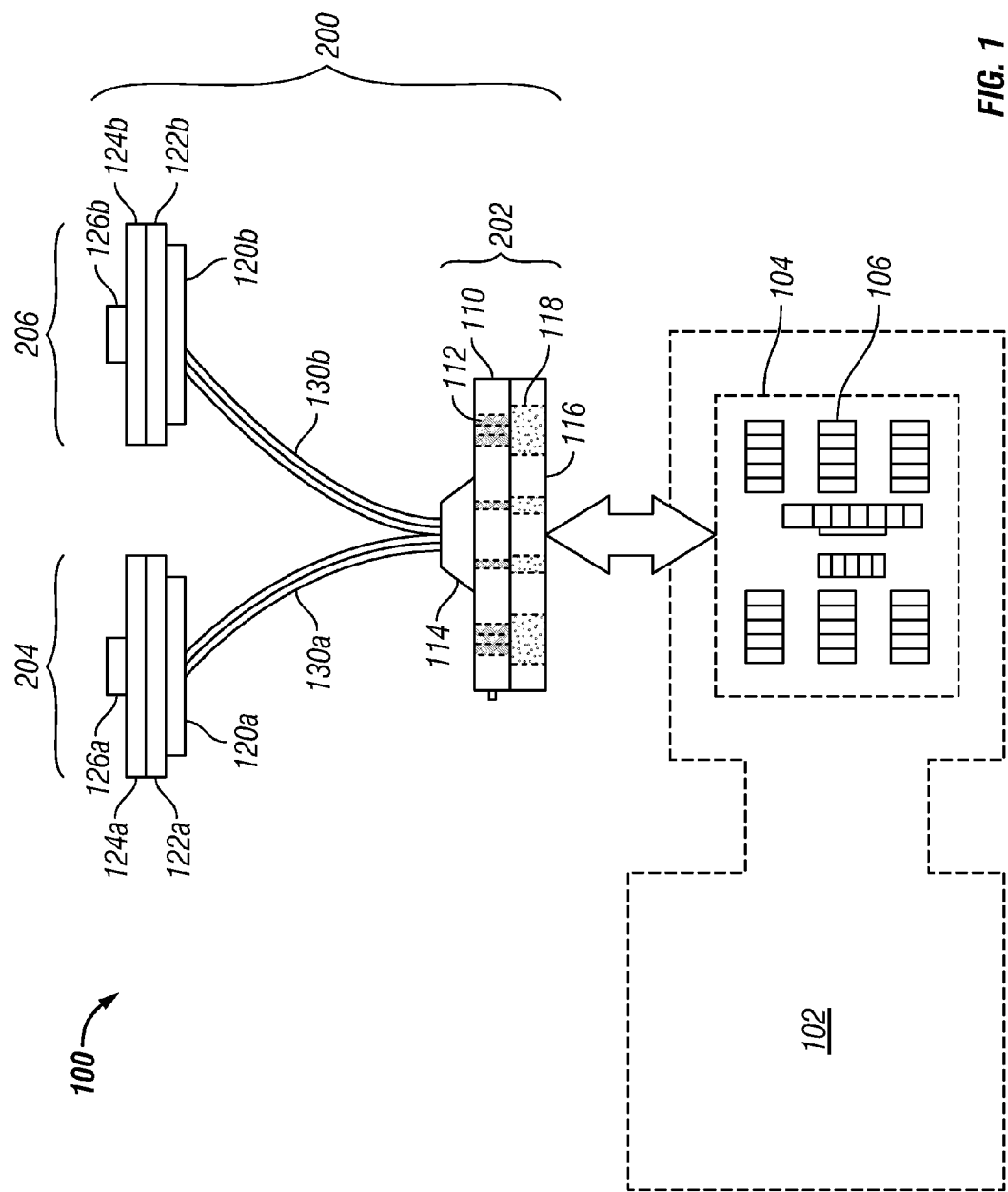
FIG. 1 illustrates a docking system of a test system, the test system includes an automatic test equipment (shown in phantom), the docking system can (but need not necessarily) be employed for multiplexed handlers (not shown), according to certain embodiments of the invention.

Referring to FIG. 1, a test system 100 includes a universal system 200 connected to an automatic test equipment (ATE) 102 (shown in phantom). The ATE 102 includes a test head 104 of pogo test pins 106 for communicative connection to devices under test (DUTs), such as integrated circuits, semiconductor chips, and/or other signal communicating devices (for example, optical devices, audible wave devices, non-visible wave devices, chemical compositions, combination devices, and other devices as applicable for the particular ATE). The ATE 102, such as via pin electronics cards for electric signal devices, tests respective DUTs when connected to the test head 104, such as via connection of DUTs to test sockets of an interface board communicatively connected to the respective pogo test pins 106. The universal system 200 includes a tester interface system 202 communicatively connected to two device under test interface systems 204 and 206.

Figure 2:
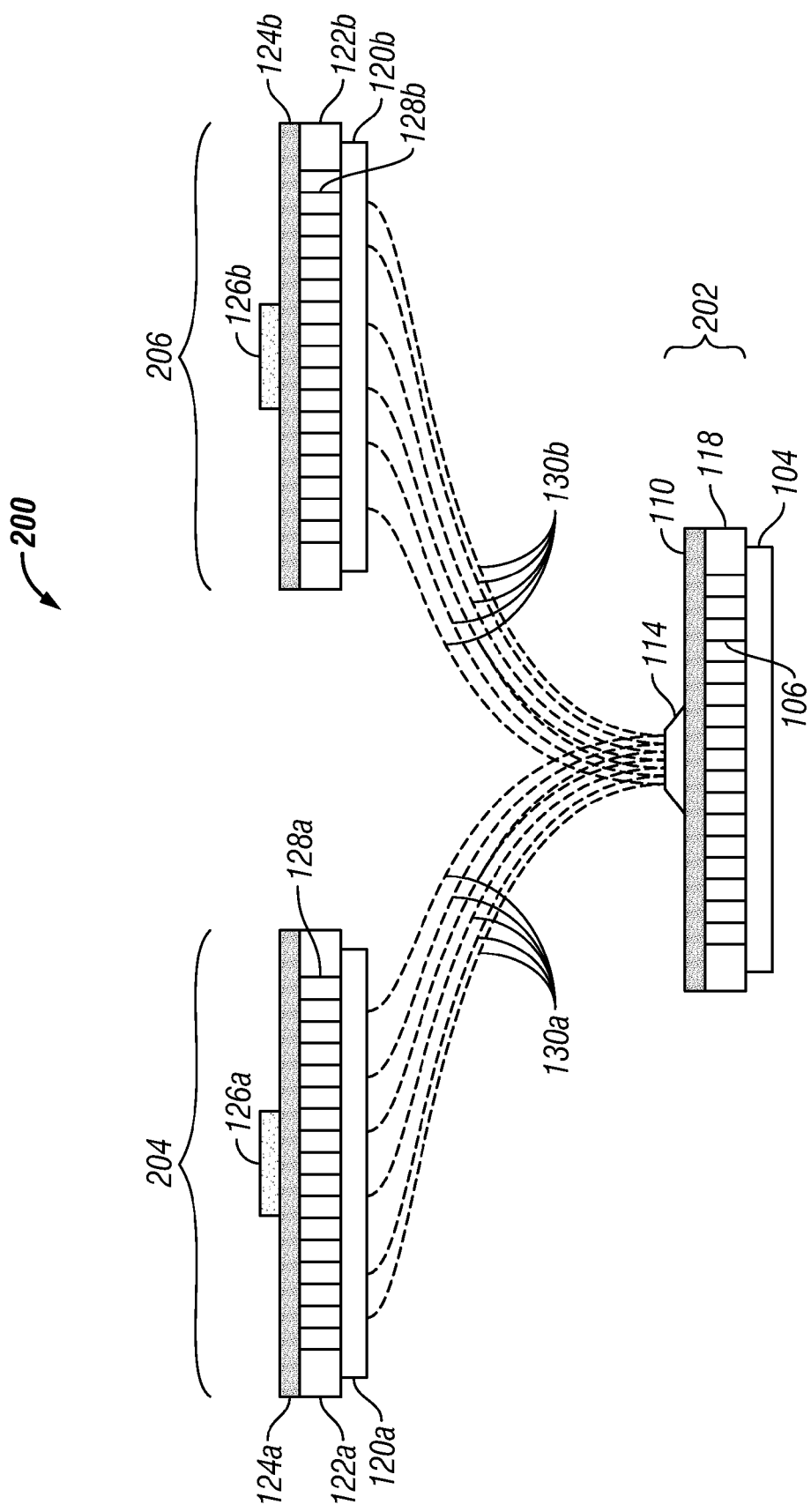
FIG. 2 illustrates a side view of a universal system for interfacing connection to an automatic test equipment (ATE), according to certain embodiments of the invention.
Figure 3:
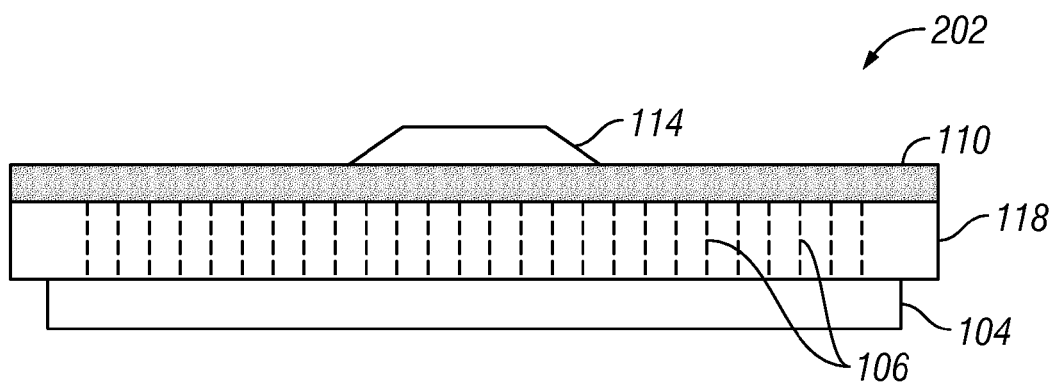
FIG. 3 illustrates a side view of a tester interface system of the universal system of FIG. 2, according to certain embodiments of the invention.

Referring to FIGS. 2 and 3, in conjunction with FIG. 1, the tester interface system 202 of the universal system 200 includes a support plate (i.e., stiffener) 208 and a tester interface board (TIB) 210. The TIB 110 engages atop the support plate 108 when the TIB 110 and the support plate 108 are mechanically connected to the test head 104 of the ATE 102. The TIB 110 of the tester interface system 102 includes respective mating connectors 112, each communicatively connected to a load board connector 114 (which may be one or more physical connector in certain embodiments, as later described) of the TIB 110. Each mating connector 112 of the TIB 110, when in use for testing, mechanically mates with a corresponding pogo test pin 106 of the test head 104 (for example, a "test head pogo block" of the test head 104 includes the pogo test pins 106) of the ATE 102 to communicatively connect the TIB 110 to each respective test signal of the ATE 102 at the pogo test pins 106.

The support plate 108, for example, an interface board stiffener device, includes support members 116 defining portal holes 118. Within the portal holes 118, respective pogo test pins 106 of the test head 104 of the ATE 102 (for example, as pins 106 may be grouped in location in the test head 104) pass through the holes 118 of the support plate 108 in use, for mechanically and communicatively connecting to the TIB 110 residing on the support plate 108. The support plate 108, in use, is sandwiched between the test head 104 and the TIB 110 when the TIB 110 and support plate 108 are mechanically locked for engagement to the test head 104. The pogo test pins 106 of the test head 104 protrude through the portal holes 118 to mate with the mating connectors 112 of the TIB 110.

Figure 4:
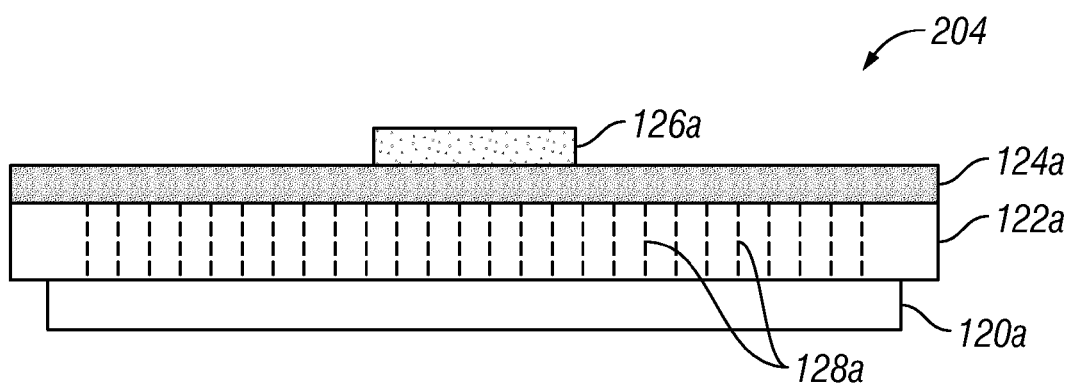
FIG. 4 illustrates a side view of a first device under test (DUT) interface system of the universal system of FIG. 2, according to certain embodiments of the invention.
Figure 5:
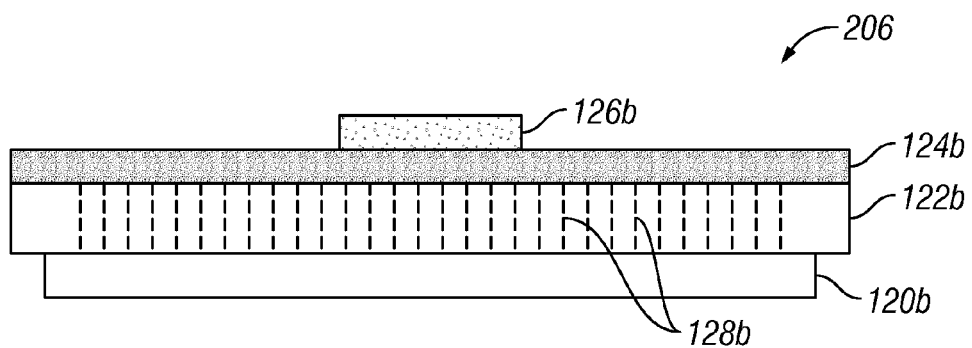
FIG. 5 illustrates a side view of a second DUT interface system of the universal system of FIG. 2, according to certain embodiments of the invention.

Referring to FIGS. 2 and 4-5, in conjunction with FIG. 1, the universal system 200 also includes the device under test (DUT) interface systems 204 and 206. Each DUT interface system 204, 206 respectively communicatively connects to the load board connector 114 (or connectors in certain embodiments, as later described) of the TIB 110, for example, by cable bundle 130a or 130b of the universal system 200. The DUT interface system 204 includes a first device interface board (First DIB) 124a ncluding one or more test socket 126a for DUTs. The First DIB 124a also includes respective mating connectors (not shown in detail) communicatively connected to each one or more test socket 126a of the First DIB 124a, for example, by electrical traces formed in the First DIB between each mating connector and corresponding test socket 126a. A device pogo block board (First Pogo Block) 120a includes a plurality of unique pogo pins 128a, each pogo pin 128a of the plurality corresponding to a respective pogo test pin 106 at the test head 104 for testing of DUTs in the one or more test socket 126a. A stiffener plate 122a engaged below the First DIB 124a is sandwiched between the First DIB 124a and the First Pogo Block 120a. The stiffener plate 122a includes portal holes allowing the pogo pins 128a from the First Pogo Block 120a to pass through the stiffener plate 122a to connect to the mating connectors of the First DIB 124a.

Similarly, a second device interface board (Second DIB) 124b includes one or more test socket 126b for DUTs. The Second DIB 124a also includes respective mating connectors (not shown in detail) communicatively connected to each one or more test socket 126b of the Second DIB 124b, for example, by electrical traces formed in the Second DIB 124b between each mating connector and corresponding test socket 126b. Another device pogo block board (Second Pogo Block) 120b includes a plurality of unique pogo pins 128b, each pogo pin 128b of the plurality corresponding to a respective pogo test pin 106 at the test head 104 for testing of DUTs in the one or more test socket 126b. A stiffener plate 122b engaged below the Second DIB 124b is sandwiched between the Second DIB 124b and the Second Pogo Block 120b. The stiffener plate 122b is formed with portal holes for passing pogo pins 128b of the Second Pogo Block 120b to mate with mating connectors of the Second DIB 124b.

In operation, the universal system 200 communicatively connects the ATE 102, via the tester interface system 202, to the DUT interface system 204 and the DUT interface system 206. During testing of DUTs by the ATE 102 in the test system 100, the tester pogo test pins 106 communicatively connect to the TIB 210 at the test head 104, each respective pogo test pin 106 is communicatively connected by the TIB 210 to respective cables of the cable bundles 130a or 130b, the cable bundles 130a, 130b respectively communicatively connect to the First Pogo Block 120a and the Second Pogo Block 120b, the First Pogo Block 120a communicatively connects to the First DIB 124a, the Second Pogo Block 120b communicatively connects to the Second DIB 124b, and the First DIB 124a communicatively connects to the one or more test socket 126a for testing DUTs in the socket 126a and the Second DIB 124a communicatively connects to the one or more test socket 126b for testing DUTs in the socket 126b.

Further in operation, DUTs are successively delivered to the one or more test socket 126a for testing of those DUTs, for example, a device handler (i.e., robotic manipulator) delivers DUTs to the socket 126a from an input location, deposits DUTs to communicatively connect them the socket 126a, maintains the DUTs in the socket 126a during testing at the socket 126a, and removes tested DUTs from the socket 126a and transfers tested DUTs to output location. For a lot (i.e., batch) or portion of a lot of DUTS for testing at the socket 126a, the device handler successively repeats the DUT handling operation until all DUTs are tested or the handling is halted. DUTs are also successively delivered to the one or more test socket 126b for testing of those DUTs, for example, another device handler (i.e., robotic manipulator) or a same device handler with two manipulators, one for each respective socket 126a, 126b, delivers DUTs to the socket 126b from an input location of those DUTs, deposits DUTs to communicatively connect them to the socket 126b, maintains the DUTs in the socket 126b during testing at the socket 126b, and removes tested DUTs from the socket 126b and transfers tested DUTs to output location. Successive DUT handling operations for the test socket 126b continue until all DUTS for test in the socket 126b are tested or the handling is halted.

The universal system 200, in use with an ATE 102 according to its applicable testing capabilities, allows for a wide variety of test schemes. For example, same ATE 102 tests can be performed for DUTs, respectively, at the DUT interface system 204 and at the DUT interface system 206. In the case of same tests, testing is controlled to alternatingly switch between the DUT interface system 204 and the DUT interface system 206 (for example, by switch of relays in the ATE or in the TIB, by a controller unit for the handlers, by processing of the handlers, by processing of the ATE, and including by software programs stored in memory, circuitry hardware and combinations, such as may be available in elements, components and/or peripherals of a particular test system in which the universal system 200 is employed). In the case of different tests at the DUT interface system 204 and the DUT interface system 206, ATE test capabilities may provide separate vector patterns for the different testing, performed by same or different pin electronics circuitry of the ATE. Parallel testing, in which same tests at the DUT interface systems 204 and 206 are conducted in alternating succession, concurrent testing, in which different or same tests are concurrently performed at the respective DUT interface system 204 and 206, and parallel concurrent testing, in which different tests at the respective DUT interface systems 204 and 206 are conducted in alternating succession, are possible with the universal system 200. Additionally, other combinations, including concurrent testing via same pin electronics at same time through parallel connections, as well as other variations, are implementable with the universal system 200.

Figure 6:
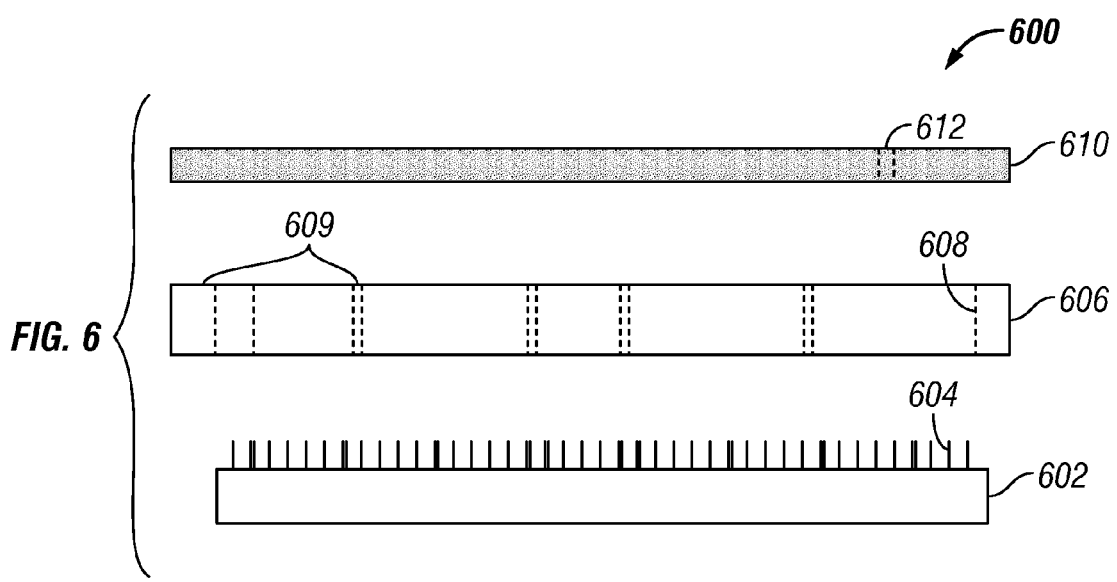
FIG. 6 illustrates a side exploded view of an exemplary multiplex unit, for example, according to the tester interface system of FIG. 3, the first DUT interface system of FIG. 4, and/or the second DUT interface system of FIG. 5, according to certain embodiments of the invention.

Referring to FIG. 6, an exemplary multiplex unit 600, for example, the tester interface system 202, and each of the DUT interface system 204 and the DUT interface system 206, of the universal system 200, includes a pogo pin unit 602. The pogo pin unit 602 of the tester interface system 202, for example, is the test head pogo pins of pin electronics of a test head of an automatic test equipment. The pogo pin unit 602 of each respective DUT interface system 204 or 206, for example, is a pogo block board or plate device including pogo pins 604 corresponding to the respective test head pogo pins for pin electronics of the test head of automatic test equipment.

In certain embodiments, the pogo pins 604 of the respective DUT interface system 204 or 206 correspond to the same location of the functionally equivalent test head pogo pins. In these embodiments, any DUT load board with sockets for DUTs (such as any available load board—i.e., tester interface board—connectable to the test head of the automatic test equipment for tests) is employed in the DUT interface system 204 or 206. The DUT load board in such embodiments need not be modified or changed in the universal system 200, therefore, all conventional DUT load boards can be employed in the DUT interface system 204 and/or 206.

Continuing to refer to FIG. 6, a support unit 606 of the exemplary multiplex unit 600 includes structure members 609 forming passageways 608. The passageways 608 are formed between structure members 609 to allow the pogo pins 604 of the pogo pin unit 602 to extend therethrough. An interface board 610, for example, the tester interface board (TIB) 210 for connection to the test head of automatic test equipment and each of the first device interface board (First DIB) 124a and the second device interface board (Second DIB) 124b with respective sockets 126a, 126b for respective DUTs, includes mating fixtures 612 for communicatively connecting to the pogo pins 604 of the pogo pin unit 602. The interface board 610 of the tester interface system 202 further includes one or more connector (shown, for example, in FIG. 3 as load board connector 114), distinctly communicatively connected to each respective mating fixture 612. The interface board 610 of the DUT interface system 204 includes one or more test socket (shown, for example, in FIG. 5 as test socket 126b), each test socket distinctly communicatively connected to each respective mating fixture 612. The interface board 610 of the DUT interface system 206 also includes one or more test socket (shown, for example, in FIG. 5 as test socket 126b), each test socket distinctly communicatively connected to each respective mating fixture 612. The mating fixtures 612 of the DUT interface system 204 and the mating fixtures 612 of the DUT interface system 206 can be substantially the same if testing is same for DUTs at the respective DUT interface systems 204, 206. If testing is different for DUTs at the respective DUT interface systems 204, 206, the mating fixtures 612 of the DUT interface system 204 correspond to particular respective function of each distinct test head pogo pin of a test head of an automatic test equipment to provide for tests applicable to the DUTs at the DUT interface system 204. Likewise, if testing is different, the mating fixtures 612 of the DUT interface system 206 correspond to particular respective function of each distinct test head pogo pin for tests applicable to DUTs at the DUT interface system 206.

As mentioned, embodiments of the universal system 200, via the particular interface board 610 of the tester interface system 202 and its cabled connections, respectively, to the DUT interface system 204 and the DUT interface system 206, allow same or different tests, or combinations tests, at the respective sockets of the DUT interface system 204 and the DUT interface system 206.

Figure 7:
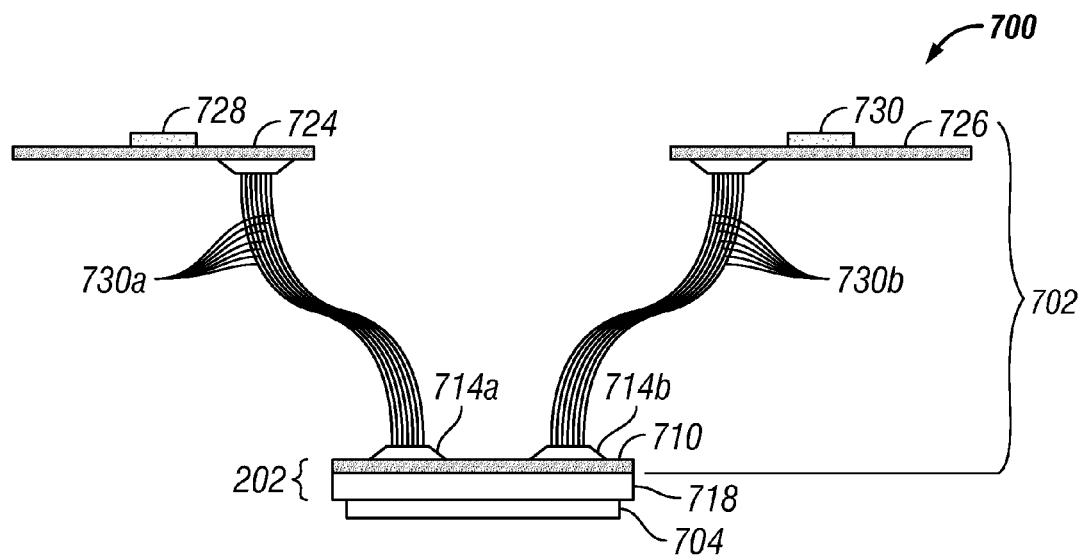
FIG. 7 illustrates a side view of a device specific interface system for connecting DUTs to an ATE, for example, in multiplexed operations, according to certain embodiments of the invention.

Referring to FIG. 7, a device specific interface system 700 for connecting DUTs to an automatic test equipment includes a tester interface system 202, substantially as previously described in embodiments. The device specific interface system 700 includes a multiplex interface system 702 of a tester interface board 710 communicatively connected to a first load board connector 714a for testing of a first type of DUTs ($DUTs_a$) and a second load board connector 714b for testing of a second type of DUTs ($DUTs_b$) (or, according to certain embodiments, a different test at the second load board connector 714b for DUTs of the first type, as applicable). Further details of the multiplex interface system 702, in use for testing, are now described.

The multiplex interface system 702 of the device specific interface system 700 includes the tester interface board 710 having mating connectors (not shown in detail) for each respective pogo pin of a test head pogo block 704 of pin electronics circuitry of a test head of the automatic test equipment. The mating connectors are each communicatively connected in the tester interface board 710, such as by respective electrical traces of the tester interface board 710, to the first load board connector 714a for testing of the $DUTs_a$ and the second load board connector 714b for testing of the $DUTs_b$. Sandwiched between the tester interface board 710 and the test head pogo block 704 can be a support plate 718 (i.e., stiffener device) for supporting and relieving stress to the tester interface board 710 communicatively connected to the test head pogo block tester 704. The support plate 718 is formed with paths (not shown in detail, but as previously described) for passage of pogo pins of the test head pogo block 704 to communicatively connect to the tester interface board 710.

The first load board connector 714a is communicatively connected, for example, by respective cables 730a, to the tester interface board 710. The respective cables 730a are each communicatively connected by the tester interface board 710, via the first load board connector 714a of the tester interface board 710, to respective ones of the pogo pins of the test head pogo block 704 for testing $DUTs_a$, which pogo pins are connected to the mating connectors of the tester interface board 710 and connected to the first load board connector 714a by the tester interface board 710. The respective cables 730b are each communicatively connected by the tester interface board 710, via the second load board connector 714b of the tester interface board 710, to respective ones of the pogo pins of the test head pogo block 704 for testing $DUTs_b$, which pogo pins are connected to the mating connectors of the tester interface board 710 and connected to the second load board connector 714b by the tester interface board 710.

The respective cables 730a are each communicatively connected to a first device board 724. The first device board 724 includes one or more test socket 728 for testing $DUTs_a$. The first device board 724 includes electrical traces (not shown in detail) communicatively connecting each respective cable 730a connected to the first device board 724, to each respective test socket 728. The respective cables 730b are each communicatively connected to a second device board 726. The second device board 726 includes one or more test socket 730 for testing $DUTs_b$. The second device board 726 includes electrical traces (not shown in detail) communicatively connecting each respective cable 730b connected to the second device board 726, to each respective test socket 730.

In operation, testing by respective tests of an automatic test machine is for $DUTs_a$ at the first device board 724 and is for $DUTs_b$ at the second device board 726. Respective handlers, or respective manipulators of a dual manipulator handler, transfer $DUTs_a$ for connection to the one or more test socket 728 and/or transfer $DUTs_b$ for connection the one or more test socket 730. Testing by the automatic test equipment may be alternated between the test socket 728 and the test socket 730 for quick succession of testing at either socket 728 or 730 at each instance. Control for alternating between sockets can be provided in any manner previously mentioned. The multiplex interface system 702, and/or the multiplex interface system 702 together with additional elements or components of the device specific interface system 700, may be unitized or segregated as respective combinations of units.

Figure 8:
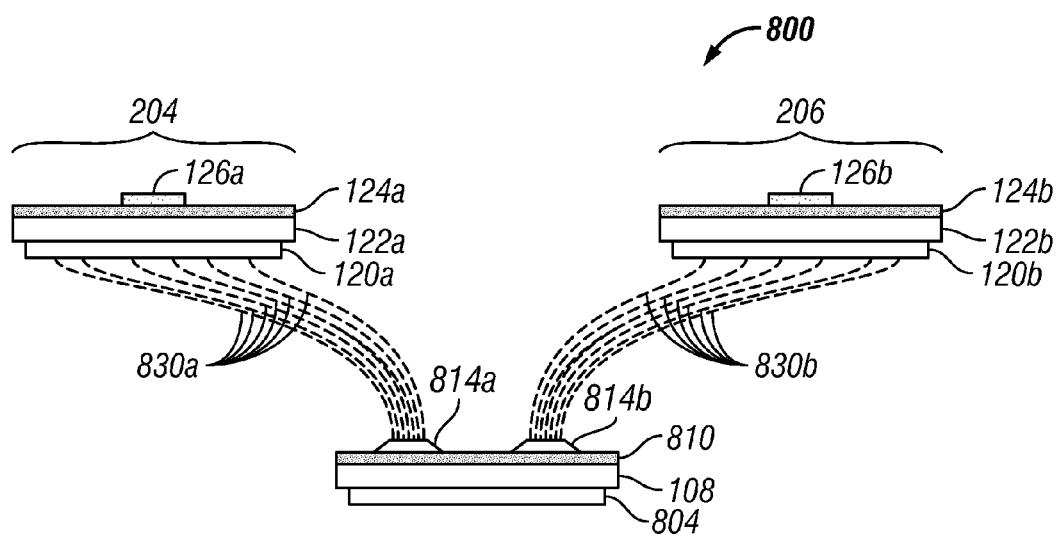
FIG. 8 illustrates a side view of an alternative universal system for interfacing connection to an ATE, according to certain embodiments of the invention.

Referring to FIG. 8, in conjunction with FIG. 1, another embodiment 800 of the universal system 200 of FIGS. 1 and 2, includes a tester interface board (TIB) 810. The TIB 810 engages atop the support plate 108 when the TIB 810 and the support plate 108 are mechanically connected to the test head 104 of the ATE 102. The TIB 810 includes respective mating connectors for communicatively connecting to respective pogo pins of a test head pogo block 804 of an automatic test equipment.

Each mating connector of the TIB 810 is respectively communicatively connected in the TIB 810, such as by respective electrical trace of the TIB 810, to a respective one of either a first load board connector 814a or a second load board connector 814b of the TIB 810 (and in the case of same test, each of the load board connectors 814a, 814b is communicatively connected to the mating connector by the TIB 810, as applicable). The first load board connector 814a of the TIB 810 is connected to cables 830a. The respective cables 830a are each communicatively connected by the TIB 810, via the first load board connector 814a of the TIB 810, to respective ones of the pogo pins of the test head pogo block 804 for testing $DUTs_a$. As mentioned, these particular pogo pins of the test head pogo block 804 are connected to the mating connectors of the TIB 810 and connected to the first load board connector 814a by the TIB 810. The respective cables 830b are each communicatively connected by the TIB 810, via the second load board connector 814b of the tester interface board 710, to respective ones of the pogo pins of the test head pogo block 804 for testing $DUTs_b$. Also as mentioned, these particular pogo pins are connected to the mating connectors of the TIB 810 and connected to the second load board connector 814b by the TIB 810.

The cables 830a are communicatively connected to a first pogo block device (First Pogo Block) 120a. The First Pogo Block 120a includes a plurality of unique pogo pins (not shown in detail, but as previously described). Each such pogo pin of the plurality corresponds to a respective pogo test pin of the test head pogo block 804 at the test head for testing of $DUTs_a$. The cables 830b are communicatively connected to a second pogo block device (Second Pogo Block) 120b. The Second Pogo Block 120b includes another plurality of unique pogo pins (not shown in detail, but as previously described). Each such pogo pin of the plurality of the Second Pogo Block 120b corresponds to a respective pogo test pin of the test head pogo block 804 at the test head for testing of $DUTs_b$.

In testing use, a first device board 124a is communicatively connected to the First Pogo Block 120a. The first device board 124a includes one or more test socket 126a for testing $DUTs_a$. The first device board 126a includes electrical traces (not shown in detail) communicatively connecting each respective pin of the First Pogo Block 120a (i.e., each such pin corresponding to a respective cable 830a and respective pogo pin of the test head pogo block 804 at the test head for test of $DUTs_a$) connected to each respective test socket 126a. Further in testing use, a second device board 124b is communicatively connected to the Second Pogo Block 120b. The second device board 124b includes one or more test socket 126b for testing $DUTs_b$. The second device board 126b includes electrical traces (not shown in detail) communicatively connecting each respective pin of the Second Pogo Block 120b (i.e., each such pin corresponding to a respective cable 830b and respective pogo pin of the test head pogo block 804 at the test head for test of $DUTs_b$) connected to each respective test socket 126b.

A stiffener plate 122a engaged below the first device board 124a is sandwiched between the first device board 124a and the First Pogo Block 120a. The stiffener plate 122a includes portal holes allowing the pogo pins of the First Pogo Block 120a to pass through the stiffener plate 122a to connect to mating connectors of the first device board 124a. Another stiffener plate 122b engaged below the second device board 124b is sandwiched between the second device board 124b and the Second Pogo Block 120b. The stiffener plate 122b includes portal holes allowing the pogo pins of the Second Pogo Block 120b to pass through the stiffener plate 122b to connect to mating connectors of the second device board 124b.

According to certain embodiments, the First Pogo Block 120a may (but need not necessarily) include pogo pins for connection to the first device board 124a in same location of pogo pins of the test head pogo block 804 for test of $DUTs_a$. In other words, the First Pogo Block 120a is configured to have same pin arrangement to that which is found in the test head pogo block 804 for performing desired test of $DUTs_a$. Similarly, the Second Pogo Block 120b may (but need not necessarily) include pogo pins for connection to the second device board 124b in same location of pogo pins of the test head pogo block 804 for test of $DUTs_b$. That is, the Second Pogo Block 120b is configured to have same pin arrangement to that which is found in the test head pogo block 804 for performing desired test of $DUTs_b$. In such embodiments, the first device board 124a and/or the second device board 124b can each be a same board as would be employable as a tester interface board directly connected to the test head of automatic test equipment via conventional hard dock for the tester interface board or indirectly connected to the test head of automatic test equipment via conventional soft dock for the tester interface board. Therefore, conventional device boards can be employed as the first device board 124a and/or the second device board 124b in the universal systems of the embodiments.

In operation, testing by respective tests of an automatic test machine is for $DUTs_a$ at the first device board 124a and is for $DUTs_b$ at the second device board 124b. Tests at the respective boards 124a or 124b can be same, different or combinations of same and different tests, according to pin electronics connections via the universal system. Respective handlers, or respective manipulators of a dual manipulator handler, transfer $DUTs_a$ for connection to the one or more test socket 126a of the first device board 124a and/or transfer $DUTs_b$ for connection to the one or more test socket 126b of the second device board 124b. Testing by the automatic test equipment may be alternated between the test socket(s) 126a and the test socket(s) 126b for quick succession of testing at either socket(s) 126a or 126b at each instance. Additionally, parallel, concurrent and parallel concurrent testing is possible with the embodiments according to pin electronic connectivity provided by the universal systems. Control for alternating (or not) testing between sockets can be provided in any manner previously mentioned or in accordance with related applications referenced and incorporated herein. The embodiments 800 of the universal system, as well as any of the foregoing embodiments, may be unitized or segregated in respective combinations of units.

EXAMPLES

Attached as Appendix A and incorporated in this specification are certain additional disclosure and examples according to embodiments.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems and device(s), connection(s) and element(s) that may cause any benefit, advantage, or solution to occur or become more pronounced are not to be construed as a critical, required, or essential feature or element of any or all the claims. As used herein, the terms "comprises, "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for communicatively connecting devices for testing to respective test pins of an automatic test equipment (ATE), comprising:
    a tester interface device physically and communicatively connected to all of the test pins of the ATE, the test interface device includes a first connector and a second connector, the first connector is physically connected to all of the test pins of the ATE and is communicatively connected by the tester interface device to a selective first group of the test pins of the ATE, and the second connector is physically connected to all of the test pins of the ATE and is communicatively connected by the test interface device to a selective second group of the test pins of the ATE,
    wherein the tester interface device includes a support plate and a tester interface board physically engaged with the support plate, the support plate having portal holes that permit test pins of the ATE to protrude through the portal holes and mate with connections on the tester interface board, all of the connections on the tester interface board being connected to a first cable and to a second cable;
    a first interface system that includes a first device board having a first test socket for testing a first device under test, a first stiffening plate, and a first block board having first block pins that are physically connected to all of the test pins of the ATE and communicatively connected to the selective first group of the test pins of the ATE via the first connector and the first cable; and
    a second interface system that includes a second device board, having a second test socket for testing a second device under test, a second stiffening plate, and a second block board having second block pins that are physically connected to all of the test pins of the ATE and communicatively connected to the selective second group of the test pins of the ATE via the second connector and the second cable,
    wherein the system has a configuration that uses a plurality of vector patterns for conducting a plurality of test schemes, including parallel testing in which same tests are conducted in alternating succession, concurrent testing in which different or same tests are concurrently performed, and parallel concurrent testing in which different tests are conducted in alternating succession.

2. The system of claim 1, further comprising:
a plurality of first test sockets of the first device board, each of the plurality of first test sockets of the first device board physically connected to all of the test pins of the ATE and communicatively connected via the first device board to each respective ATE test pin of the selective first group; and
a plurality of second test sockets of the second device board, each of the plurality of second test sockets of the second device board physically connected to all of the test pins of the ATE and communicatively connected via the second device board to each respective ATE test pin of the selective second group.

3. The system of claim 1,
wherein the first group of the test pins of the ATE and the second group of test pins of the ATE are mutually exclusive.

4. The system of claim 1,
wherein the first group of test pins of the ATE and the second group of test pins of the ATE are not mutually exclusive.

5. A system for communicatively connecting devices for testing to respective test pins of an automatic test equipment (ATE), comprising:
a tester interface device physically and communicatively connected to all of the test pins of the ATE, the tester interface device includes a first connector and a second connector, the first connector is physically connected to all of the test pins of the ATE and is communicatively connected by the tester interface device to a selective first group of the test pins of the ATE, and the second connector is physically connected to all of the test pins of the ATE and is communicatively connected by the tester interface device to a selective second group of the test pins of the ATE,
wherein the tester interface device includes a support plate and a tester interface board physically engaged with the support plate, the support plate having portal holes that permit test pins of the ATE to protrude through the portal holes and mate with connections on the tester interface board, all of the connections on the test interface board being connected to a first cable and to a second cable;
a first pogo pin block device that includes a first load board having a first test socket for testing a device under test, a first stiffening plate, and a first pogo block board having first block pogo pins that are physically connected to all of the test pins of the ATE and communicatively connected to the selective first group of the test pins of the ATE via the first connector and the first cable;
a second pogo pin block device that includes a second load board having a second test socket for testing a device under test, a second stiffening plate, and a second pogo block board having second block pogo pins that are physically connected to all of the test pins of the ATE and communicatively connected to the selective second group of the test pins of the ATE via the second connector and the second cable,
wherein the system has a configuration that uses a plurality of vector patterns for conducting a plurality of test schemes, including parallel testing in which same tests are conducted in alternating succession, concurrent testing in which different or same tests are concurrently performed, and parallel concurrent testing in which different tests are conducted in alternating succession.

6. The system of claim 5,
wherein the first load board includes at least one first test socket for at least a portion of the devices that is physically and communicatively connectable to the first pogo pin block device for testing of the portion of the devices in the at least one first test socket;
wherein the second load board includes at least one second test socket for at least another portion of the devices that is physically and communicatively connectable to the second pogo pin block device for testing of the portion of the devices in the at least one second test socket.

7. The system of claim 6,
wherein testing of the portion of the devices in the at least one first test socket and testing of the another portion of the devices in the at least one second socket is selected from: parallel test, concurrent test, parallel concurrent test, and combinations of different tests.

8. The system of claim 6,
wherein the first pogo block device replicates a location of at least a portion of the respective test pins of the ATE, the portion of the respective test pins uniquely for testing of the portion of the devices via the at least one first test socket;
wherein the second pogo block device replicates a location of at least another portion of the respective test pins of the ATE, the portion of the respective test pins uniquely for testing of the portion of the devices via the at least one second test socket.

9. The system of claim 8, further comprising:
a first manipulator for depositing the portion of the devices for testing in the at least one test socket in succession; and
a second manipulator for depositing the another portion of the devices for testing in the at least one second socket in succession.

10. The system of claim 9,
wherein the first manipulator and the second manipulator are a first handler equipment and a second handler equipment, respectively.

11. The system of claim 9,
wherein the first manipulator and the second manipulator are multiplexed for depositing, respectively, the portion of the devices for testing in the at least one test socket in succession and the another portion of the devices for testing in the at least one second socket in succession, for testing the at least one first test socket and the at least one second socket selected from: parallel test, concurrent test, parallel concurrent test, and combinations.

12. The system of claim 8,
wherein the first load board connected to the first pogo block device is a first conventional device interface board for providing a docking connection to the ATE and the second load board connected to the second pogo block device is a second conventional device interface board for providing a docking connection to the ATE.

13. The system of claim 5,
wherein the first group of the test pins of the ATE and the second group of test pins of the ATE are mutually exclusive.

14. The system of claim 5,
wherein the first group of test pins of the ATE and the second group of test pins of the ATE are not mutually exclusive.

15. A method of docking to an automatic test equipment (ATE), comprising:
providing a tester interface board with respective mating connectors that are physically and communicatively connected to respective test pins of a test head of the ATE, wherein the tester interface board physically engaged with a support plate, the support plate having portal holes that permit test pins of the test head of the ATE to protrude through the portal holes and mate with connections on the tester interface board;

providing a first interface system that includes a first load board having a first test socket for testing a first device under test, a first stiffening plate, and a first pogo pin block having first pogo pins;

providing a second interface system that includes a second load board having a second test socket for testing a second device under test, a second stiffening plate, and a second pogo pin block having second pogo pins;

physically connecting all of the mating connectors of the tester interface board to the first pogo pin block via a first cable and to the second pogo pin block via a second cable;

first communicatively connecting at least a selective portion of the mating connectors of the tester interface board to the first pogo pin block load board via the first cable; and second communicatively connecting at least another selective portion of the mating connectors of the tester interface board to the second pogo pin block load board via the second cable, wherein the method of docking the tester interface board with the ATE provides a system configuration that uses a plurality of vector patterns for conducting a plurality of test schemes, including parallel testing in which same tests are conducted in alternating succession, concurrent testing in which different or same tests are concurrently performed, and parallel concurrent testing in which different tests are conducted in alternating succession.

16. The method of claim 15,
wherein the portion of the mating connectors and the another portion of the mating connectors are mutually exclusive.

17. The method of claim 15,
wherein the portion of mating connectors and the another portion of mating connectors are not mutually exclusive.

\* \* \* \* \*